United States Patent
Torii et al.

(10) Patent No.: US 9,927,990 B2
(45) Date of Patent: Mar. 27, 2018

(54) MEMORY SYSTEM, MEMORY CONTROLLER AND MEMORY CONTROL METHOD

(71) Applicant: Toshiba Memory Corporation, Minato-ku (JP)

(72) Inventors: Osamu Torii, Setagaya (JP); Tokumasa Hara, Kawasaki (JP); Hironori Uchikawa, Fujisawa (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 13 days.

(21) Appl. No.: 15/066,298

(22) Filed: Mar. 10, 2016

(65) Prior Publication Data

US 2017/0075599 A1 Mar. 16, 2017

Related U.S. Application Data

(60) Provisional application No. 62/216,808, filed on Sep. 10, 2015.

(51) Int. Cl.
| | | |
|---|---|---|
| *G06F 11/10* | (2006.01) | |
| *G06F 3/06* | (2006.01) | |
| *G11C 29/52* | (2006.01) | |

(52) U.S. Cl.
CPC ......... *G06F 3/0619* (2013.01); *G06F 3/0638* (2013.01); *G06F 3/0679* (2013.01); *G06F 11/1068* (2013.01); *G11C 29/52* (2013.01)

(58) Field of Classification Search
CPC .................................................. G06F 11/1076
USPC ................................ 714/764, 767, 770, 773
See application file for complete search history.

(56) References Cited

U.S. PATENT DOCUMENTS

| 5,771,348 A * | 6/1998 | Kubatzki ......... G07B 17/00362 |
| | | 714/36 |
| 8,756,365 B2 | 6/2014 | Sharon et al. |
| 8,848,442 B2 | 9/2014 | Sharon et al. |
| 8,966,351 B2 * | 2/2015 | Uchikawa ............ H03M 13/116 |
| | | 714/755 |
| 2013/0238959 A1 | 9/2013 | Birk et al. |

FOREIGN PATENT DOCUMENTS

JP  2012-133835  7/2012

* cited by examiner

*Primary Examiner* — Fritz Alphonse
(74) *Attorney, Agent, or Firm* — Oblon, McClelland, Maier & Neustadt, L.L.P.

(57) ABSTRACT

According to an embodiment, a memory system includes: a non-volatile memory; an encoding unit that generates a code word in which zero and one occur at different occurrence rates by encoding data; and a control unit that writes k third data items and fourth data items into the non-volatile memory. The k is an integer larger than or equal to zero and smaller than or equal to n. The n is an integer larger than or equal to two. The k third data items are obtained by encoding k second data items with the encoding unit among first data items including n second data items and having a first data length. The fourth data items are obtained by removing data corresponding to the k third data items from the first data items. The third data items are generated by encoding the second data items with encoders, respectively.

20 Claims, 12 Drawing Sheets

FIG.2

| INFORMATION SOURCE SIGNAL | CODE WORD |
|---|---|
| 1001 | 11010 |
| 1011 | 01110 |
| 1111 | 1111110 |
| 0011 | 1010 |
| 1101 | 0110 |
| 1100 | 1100 |
| 0000 | 111110 |
| 0110 | 010 |
| 0001 | 100 |
| 0111 | 11110 |
| 1000 | 11011 |
| 1010 | 01111 |
| 1110 | 1111111 |
| 0100 | 00 |
| 0101 | 1110 |
| 0010 | 1011 |

FIG.9

| INFORMATION SOURCE SIGNAL | CODE WORD |
|---|---|
| 0110 | 11010 |
| 0100 | 01110 |
| 0000 | 1111110 |
| 1100 | 1010 |
| 0010 | 0110 |
| 0011 | 1100 |
| 1111 | 111110 |
| 1001 | 010 |
| 1110 | 100 |
| 1000 | 11110 |
| 0111 | 11011 |
| 0101 | 01111 |
| 0001 | 1111111 |
| 1011 | 00 |
| 1010 | 1110 |
| 1101 | 1011 |

MEMORY SYSTEM, MEMORY CONTROLLER AND MEMORY CONTROL METHOD

CROSS-REFERENCE TO RELATED APPLICATIONS

This application is based upon and claims the benefit of priority from U.S. Provisional Application No. 62/216,808, filed on Sep. 10, 2015; the entire contents of which are incorporated herein by reference.

FIELD

Embodiments described herein relate generally to a memory system, a memory controller, and a memory control method.

BACKGROUND

The reliability of a semiconductor memory varies depending on the pattern of the written values. Thus, the user data is encoded and written into the semiconductor memory in order to increase the reliability with the pattern. This encoding can improve the reliability for the written data.

BRIEF DESCRIPTION OF THE DRAWINGS

FIG. 2 is a diagram of exemplary code words generated by Reverse Tunstall coding;

FIG. 9 is a diagram of exemplary Reverse Tunstall coding different from the Reverse Tunstall coding illustrated in FIG. 2;

DETAILED DESCRIPTION

In general, according to one embodiment, a memory system includes an encoding unit, and a control unit. The encoding unit generates a code word in which zero and one occur at different occurrence rates from each other by encoding data. The control unit writes k third data items and fourth data items into a non-volatile memory. The k is an integer more than or equal to zero and less than or equal to n. The n is an integer more than or equal to two. First data includes n second data items and has a first data length. The k third data items are obtained by encoding the k second data items in the first data with the encoding unit. The fourth data items are obtained by removing the data corresponding to the k third data items from the first data. The third data items are generated by encoding the data items with the encoders, respectively.

Exemplary embodiments of a memory system, a memory controller, and a memory control method will be explained below in detail with reference to the accompanying drawings. The present invention is not limited to the following embodiments.

First Embodiment

Figure 1:
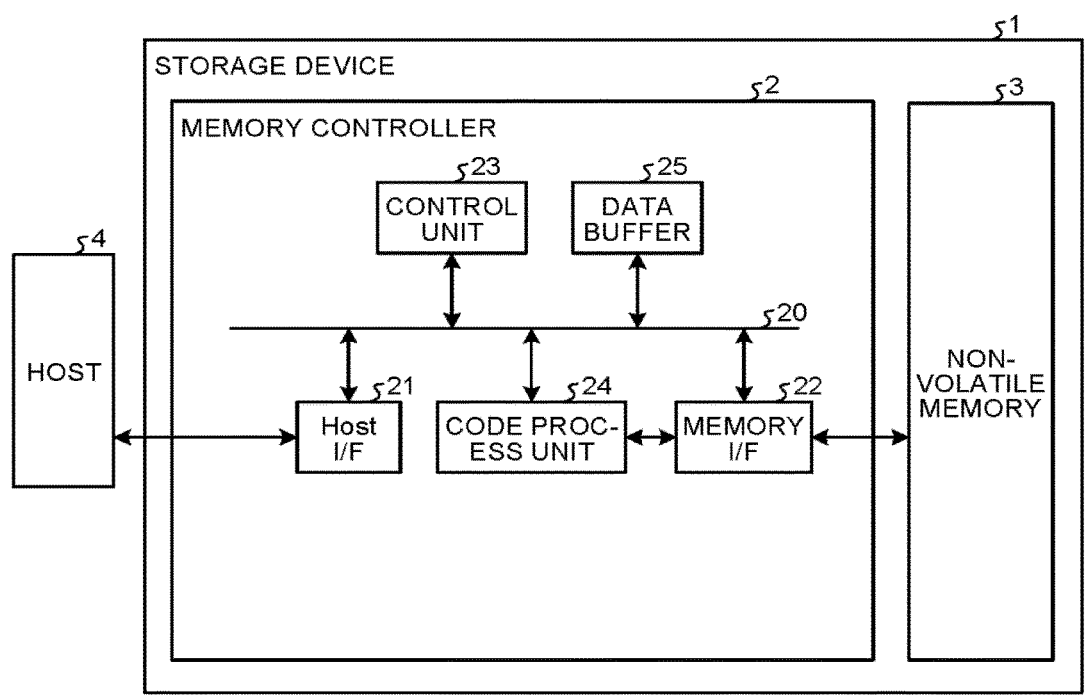
FIG. 1 is a block diagram of an exemplary configuration of a storage device according to a first embodiment.

FIG. 1 is a block diagram of an exemplary configuration of a memory system (a storage device) according to a first embodiment. A storage device 1 according to the present embodiment includes a memory controller 2 and a non-volatile memory 3. The storage device 1 can be connected to a host 4. FIG. 1 illustrates that the host 4 is connected to the storage device 1. The host 4 is an electronic device such as a personal computer, or a mobile terminal.

The non-volatile memory 3 stores data in a non-volatile way. The non-volatile memory 3 is, for example, a NAND memory. Note that, although the non-volatile memory 3 is described as a NAND memory in the present embodiment, a storage unit other than a NAND memory, for example, a three-dimensionally-structured flash memory, a Resistance Random Access Memory (ReRAM), or a Ferroelectric Random Access Memory (FeRAM), can be used as the non-volatile memory 3. Although a semiconductor memory is cited as an exemplary storage unit herein, an error correction process according to the present embodiment is applied for a storage device including a storage unit other than a semiconductor memory.

The storage device 1 can be, for example, a memory card in which the memory controller 2 and the non-volatile memory 3 form a package, or a Solid State Drive (SSD).

The memory controller 2 controls the writing of data to the non-volatile memory 3 in accordance with a write command (request) from the host 4. The memory controller 2 further controls the reading of data from the non-volatile memory 3 in accordance with a read command from the host 4. The memory controller 2 includes a Host interface (I/F) 21, a memory interface (I/F) 22, a control unit 23, a code process unit 24, and a data buffer 25. The Host I/F 21, the memory I/F 22, the control unit 23, the code process unit 24, and the data buffer 25 are connected to each other by an internal bus 20.

The Host I/F 21 performs a process in accordance with the interface standard between the host 4 and the Host I/F 21 to output, for example, an instruction or user data received from the host 4 to the internal bus 2C. The Host I/F 21 transmits, for example, the user data read from the non-volatile memory 3, or a response from the control unit 23 to the host 4. Note that the data to be written into the non-volatile memory 3 in accordance with the write request from the host 4 is referred to as the user data in the present embodiment. The user data is encoded with the code process unit 24 as described below and then stored in the non-volatile memory 3.

The memory I/F 22 performs a writing process for writing data to the non-volatile memory 3 in accordance with an instruction from the control unit 23. The memory I/F 22 performs a reading process for reading data from the non-volatile memory 3 in accordance with an instruction from the control unit 23. In other words, the control unit 23 writes and reads data to and from the non-volatile memory 3 through the memory I/F 22.

The control unit 23 generally controls each component in the storage device 1. When receiving an instruction from the host 4 through the Host I/F 21, the control unit 23 performs a control in accordance with the instruction. For example, when receiving a write request from the host 4, the control unit 23 instructs the code process unit 24 to encode the user data, and instructs the memory I/F 22 to write the encoded user data, namely, code words to the on-volatile memory 3. When receiving a read request from the host 4, the control unit 23 instructs the memory I/F 22 to read the reception words corresponding to the user data in the reading request from the non-volatile memory 3, and instructs the code process unit 24 to decode the reception words.

When receiving a write request from the host 4, the control unit 23 determines the storage region (the memory region) in the non-volatile memory 3 for the user data to be accumulated in the data buffer 25. In other words, the control unit 23 manages the destination to which the user data is to be written. The correspondence between the logical address of the user data received from the host 4 and the physical address of the storage region in which the user data is stored in the non-volatile memory 3 is stored as an address mapping table.

When receiving a read request from the host 4, the control unit 23 converts the logical address designated in the read request into a physical address using the address mapping table, and instructs the memory I/F 22 to read the data from the physical address.

A common NAND memory writes and reads data in a data unit referred to as a page, and deletes data in a data unit referred to as a block. In the present embodiment, a plurality of memory cells connected to a word line is referred to a memory cell group. When the memory cell is a single-level cell (SLC), a memory cell group corresponds to a page. When the memory cell is a multi-level cell (MLC), a memory cell group corresponds to a plurality of pages. Each of the memory cells is connected also to a bit line while being connected to a word line. Each of the memory cells can be identified from the address identifying the word line and the address identifying the bit line.

The data buffer 25 temporarily stores the user data that the memory controller 2 receives from the host 4 until the user data is stored in the non-volatile memory 3. The data buffer 25 temporarily stores also the user data read from the non-volatile memory 3 until the user data is transmitted to the host 4. The data buffer 25 temporarily stores also the code words obtained by encoding the user data. The data buffer 25 is formed, for example, by a general-purpose memory such as a Static Random Access Memory (SRAM) or a Dynamic Random Access Memory (DRAM).

The user data transmitted from the host 4 is transferred to the internal bus 20 and stored in the data buffer 25.

The code process unit 24 generates code words by encoding the user data stored in the data buffer 25. The code process unit 24 decodes the reception word read from the non-volatile memory 3. The encoding in the present embodiment is a process for generating a code word in which zero and one occur at skewed occurrence rates. What is meant by the skewed occurrence rates of zero and one is that zero and one occur at different occurrence rates, and, for example, the difference between the occurrence rates of zero and one is larger than or equal to a predetermined value. When the non-volatile memory 3 is, for example, a NAND memory, the skewed occurrence rates of zero and one decrease the probability that the values of the data written into the non-volatile memory 3 changes while the data is written and read in comparison with similar occurrence rates of zero and one. In other words, the skewed occurrence rates of zero and one increase the reliability for the written data. In the present embodiment, the user data is encoded in order to increase the reliability.

As encoding for generating a code word in which zero and one occur at skewed occurrence rates, there are a scheme in which a code word with a fixed bit length is generated by the encoding of an information source signal with a fixed bit length (the data that is not encoded yet), a scheme in which a code word with a variable bit length is generated by the encoding of an information source signal with a fixed bit length, and a scheme in which a code word with a fixed bit length is generated by the encoding of an information source signal with a variable bit length. Hereinafter, the scheme in which a code word with a fixed bit length is generated by the encoding of an information source signal with a fixed bit length is referred to as a fixed length scheme. The scheme in which a code word with a variable bit length is generated by the encoding of an information source signal with a fixed bit length, the scheme in which a code word with a fixes bit length is generated by the encoding of an information source signal with a variable bit length, and the scheme in which a code word with a variable bit length is generated by the encoding of an information source signal with a variable bit length are referred to as a variable length scheme. Generally, the variable length scheme can be performed with a high average encoding ratio in comparison with the fixed length scheme. In other words, when the variable length scheme and the fixed length scheme have the same encoding ratios, the variable length scheme can increase the difference between occurrence rates of zero and one more than the fixed length scheme does.

However, when one or more code words (encoded sequence) are generated by the encoding of data with a predetermined bit length with the variable length scheme and the encoded sequence is written into the memory region with a fixed size in the non-volatile memory 3, the ratio of the predetermined bit length to the bit length of the encoded sequence is not fixed. This makes it difficult to write the encoded sequence to the memory region with a fixed size in the non-volatile memory 3. If the fixed size of the memory region increases to a large value, for example, larger than or equal to the bit length of the largest assumed encoded sequence so that an arbitrary encoded sequence can be written, the bit length of the encoded sequence that is actually generated is often smaller than the bit length of the largest encoded sequence. Thus, it may be impossible to efficiently use the memory region and many memory regions are required. This increases the cost.

The present embodiment does not encode a part of the user data in order to efficiently use the memory region while performing the encoding with the variable length scheme. Specifically, the code process unit 24 according to the present embodiment does not encode a part of the user data when the bit length of the data obtained by encoding the user data with a predetermined size exceeds a predetermined bit length.

The code process unit 24 can encode data with any encoding scheme as long as the encoding scheme is a variable length scheme. Specifically, the code process unit 24 can use, for example, Reverse Huffman coding, Reverse Tunstall coding, or Reverse Tunstall Huffman coding. The Reverse Huffman coding is a process opposite to Huffman coding. The Reverse Tunstall Huffman coding is a process opposite to the Tunstall Huffman coding. The Reverse Tunstall coding is a process opposite to the Tunstall coding. The Huffman coding and the Tunstall coding are used, for example, for data compression. The Tunstall Huffman coding is used for further encoding the result from the Tunstall coding with the Huffman coding.

FIG. 2 is a diagram of exemplary code words generated by Reverse Tunstall coding. Values of four-bit information source signals are illustrated in the left field in FIG. 2. The code word corresponding to each of the information source signals is illustrated in the right field in FIG. 2. As illustrated in the drawing, the number of bits of the generated code word is not fixed in Reverse Tunstall coding while the information source signal that is an input is fixed as a four-bit signal. Thus, the bit length of the code word group generated by the encoding of each information source signal obtained by dividing the information source sequence varies depending on the value of the information source sequence.

The encoding process in the present embodiment will be described in detail next. In the present embodiment, the encoding process is performed in a unit of the user data with a first bit length that is a fixed length. When the encoded code sequence exceeds a second bit length $L_{th}$ ($L_{th}$ is an integer more than or equal to one) that is a fixed length, a part of the user data is not encoded.

The user data with the first bit length (a first data length), namely, the data that has the first bit length and is not encoded yet is referred to as the information source sequence (the first data). The information source sequence is the user data with a fixed bit length that is a unit of data to be encoded. There is no limitation on the fixed bit length. For example, the information source sequence can be obtained by dividing the user data to be written into a page of the non-volatile memory 3 (hereinafter, referred to as a unit data item) into a plurality of data items, can be a unit data item, or can be a plurality of unit data items. In the present embodiment, the information source sequence is divided into information source signals that is the user data corresponding to a code word in order to encode the information source sequence by each of the information source signals. For example, the length of the information source sequence that is the first bit length has four kbytes (4096 bytes) and each of the information source signals is four bits in the bit length. In the example, the information source sequence is divided into 1024 information source signals.

As described above in the present embodiment, the information source sequence is divided into information source signals. The information source signals are sequentially encoded. When the total bit length of the encoded information source signals and the yet-to-be-encoded information source signals in the information source sequence exceeds $L_{th}$ (the second data length), the last generated code word is discarded and the encoding is terminated. When the encoding is terminated, a yet-to-be-encoded information source signal corresponding to the discarded code word and the yet-to-be-encoded information source signals are written into the non-volatile memory 3 without being encoded. In other words, k second data items are encoded among n second data items (the yet-to-be-encoded information source signals) included in the first data (the information source sequence). The k is an integer more than or equal to zero and less than or equal to n. The n is an integer more than or equal to one. The k code words (third data items) obtained by encoding the k second data items, and (n−k) second data items obtained by removing the k second data items from the first data are written into the non-volatile memory 3.

Figure 3:
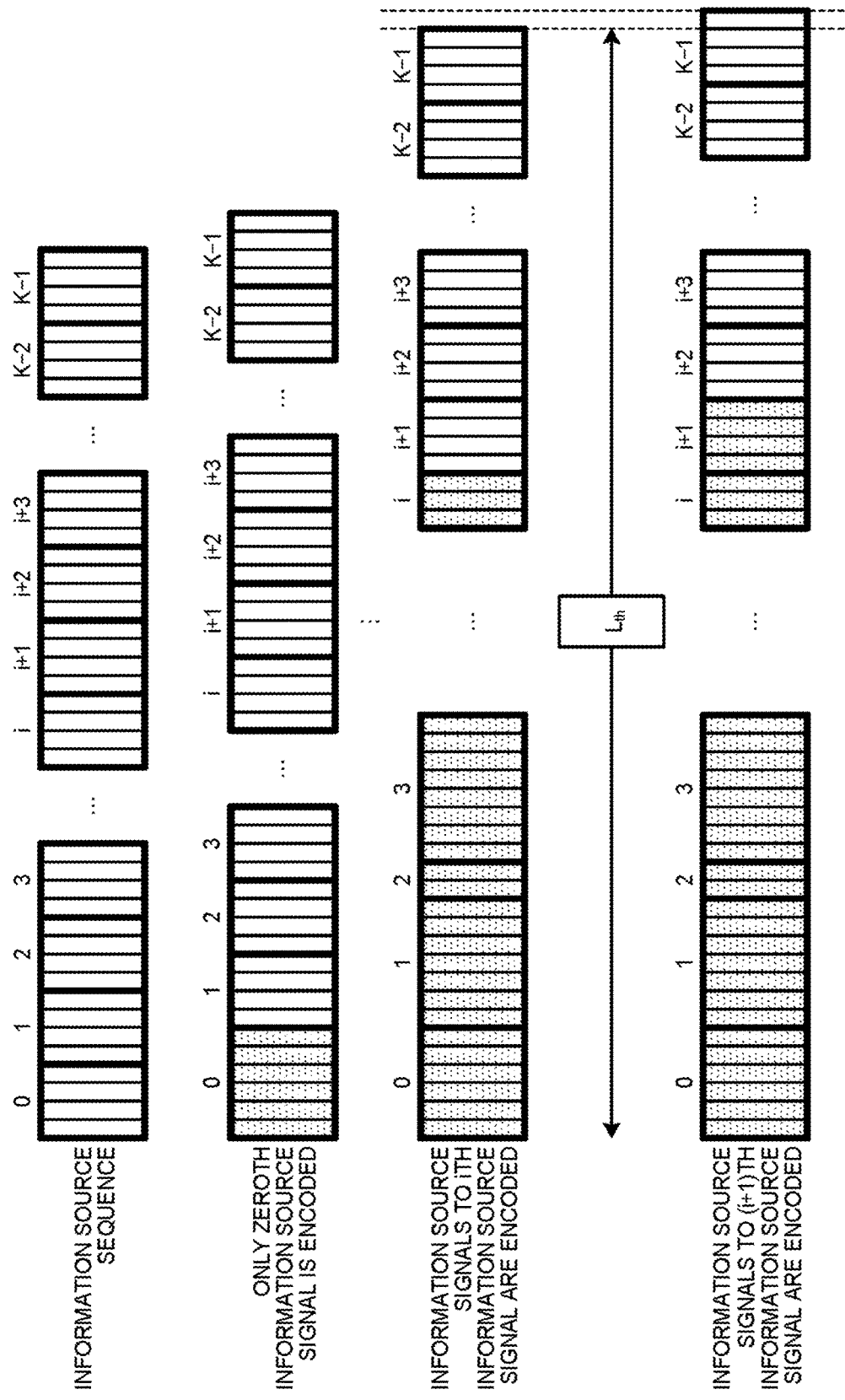
FIG. 3 is a diagram of exemplary encoding and writing of data to a non-volatile memory according to the first embodiment.

FIG. 3 is a diagram of exemplary encoding and writing of data to the non-volatile memory 3 according to the present embodiment. An information source sequence is illustrated on the first row in FIG. 3. Hereinafter, the bit length of the information source sequence, namely, the first bit length has B (B is an integer more than or equal to one). Small rectangles illustrated in FIG. 3 are a bit. Parts shaded with dots are code words, and the other parts that are not shaded are the information source signals in FIG. 3. In the example illustrated in FIG. 3, the information source sequence with B bits is divided into K information source signals with four bits. The K is the number of information source sequences forming an information source sequence. When the information source signal has four bits, B=4×K holds.

A state in which a zeroth information source signal is encoded and first to (K−1)th information source signals are not encoded is illustrated on the second row in FIG. 3. In the state, the total bit length of a code word obtained by encoding the zeroth information source signal and the first to (K−1)th information source signals is shorter than $L_{th}$. A state in which the information source signals to an ith (i=1, . . . , K−1) information source signal are encoded is illustrated in the third row in FIG. 3. In the state, the total bit length of the generated code words and the (i+1)th to (K−1)th information source signals is shorter than or equal to $L_{th}$.

A state in which the information source signals to the (i+1)th information source signal are encoded is illustrated in the fourth row in FIG. 3. In the state, the total bit length of the generated code words and the (i+2)th to (K−1)th information source signals exceeds $L_{th}$. In the present embodiment in such a case, the encoded zeroth to ith information source signals, namely, the code words are written into the non-volatile memory 3 while the (i+1)th to (K−1)th information source signals are not encoded and the yet-to-be-encoded information source signals are written into the non-volatile memory 3. Note that, when the bit length of the code words obtained by encoding all of the information source signals forming the information source sequence is shorter than or equal to $L_{th}$, all of the information source signals are encoded and stored in the non-volatile memory 3.

Note that FIG. 3 illustrates that the information source signal with a fixed bit length is encoded and a code word with a variable bit length is generated. When the information source signal with a variable bit length is encoded and a code word with a fixed bit length is generated, the bit length of the information source sequence is B and the information source signals are sequentially encoded from the top of the information source sequence. As a result, in accordance with the total size of the information source sequence that is the source of the code words to the latest generated code word, and B, the size (the bit length) of the part that is not encoded in the information source sequence can be found every time a code word is generated. This can calculate how many code words are to be generated, namely, the value corresponding to the i in FIG. 3 such that the sum of the total size of the generated code words and the total size of the yet-to-be-encoded part in the information source sequence is smaller than or equal to $L_{th}$, and the yet-to-be-encoded part in the information source sequence is minimized in size. In other words, when the yet-to-be-encoded part is regarded as an information source signal, k second data items are encoded among the n second data items (information source signals) included in the first data. Subsequently, k code words obtained by encoding the k second data items, and (n−k) second data items obtained by removing the k second data items from the first data are written into the non-volatile memory 3. However, (n−k) is constantly one, and n is not fixed value and can vary depending on the information source sequence in such a case.

As described above, when the total bit length of the generated code words and yet-to-be-encoded information source signals exceeds $L_{th}$, the encoding is terminated in the present embodiment. The yet-to-be-encoded information source signals are written into the non-volatile memory 3 without being encoded. As a result, the encoded information source sequence can be written into the memory region with a fixed size.

For example, the memory region large enough to store the longest bit length after an encoding is secured in the non-volatile memory 3 such that all of the encoded information source signals forming an information source sequence can be stored. This means that it is necessary to secure the memory region large enough to store the bit length of the number of information source signals forming the information source sequence×the largest number of bits of code words. For example, the longest bit length of a generated code word is seven in the exemplary encoding illustrated in FIG. 2. Thus, it is necessary to secure the memory region large enough to store a bit length of the number of the information source signals forming the information source sequence×seven bits. On the other hand, the memory region to be secured can be determined from $L_{th}$ in the present embodiment. Thus, $L_{th}$ is set at a smaller value than the bit length corresponding to the memory region large enough to store the longest bit length after an encoding in the non-volatile memory 3. This can curb the increase in size of the necessary memory region if the encoding in the variable length scheme is used.

In the present embodiment, in order to determine whether the data is encoded when the data is read, it is necessary to store the information indicating the last encoded code word, for example, the total number of bits of zeroth to ith code words as illustrated in FIG. 3. The information about what number information source signal is the last encoded signal is hereinafter referred to as encoding information. Hereinafter, an example in which the encoding information is stored together with the encoded information source sequence (the zeroth to ith code words and the (i+1)th to (K−1)th information source signals) in the non-volatile memory 3. For example, the encoding information about the encoded information source sequences can be stored in a predetermined region. Alternatively, the encoding information about an encoded information source sequence can be stored in the page in which the encoded information source sequence is stored. When a plurality of information source sequences is stored in a page, the encoding information about the information source sequences can be stored in a predetermined region in the page. This enables the encoding information to be read from the non-volatile memory 3 together when the information source sequence is read from the non-volatile memory 3. The method for storing the encoding information is not limited to these examples. The encoding information can be stored in a predetermined region of the non-volatile memory 3 or can be stored in the memory controller 2.

Figure 4:
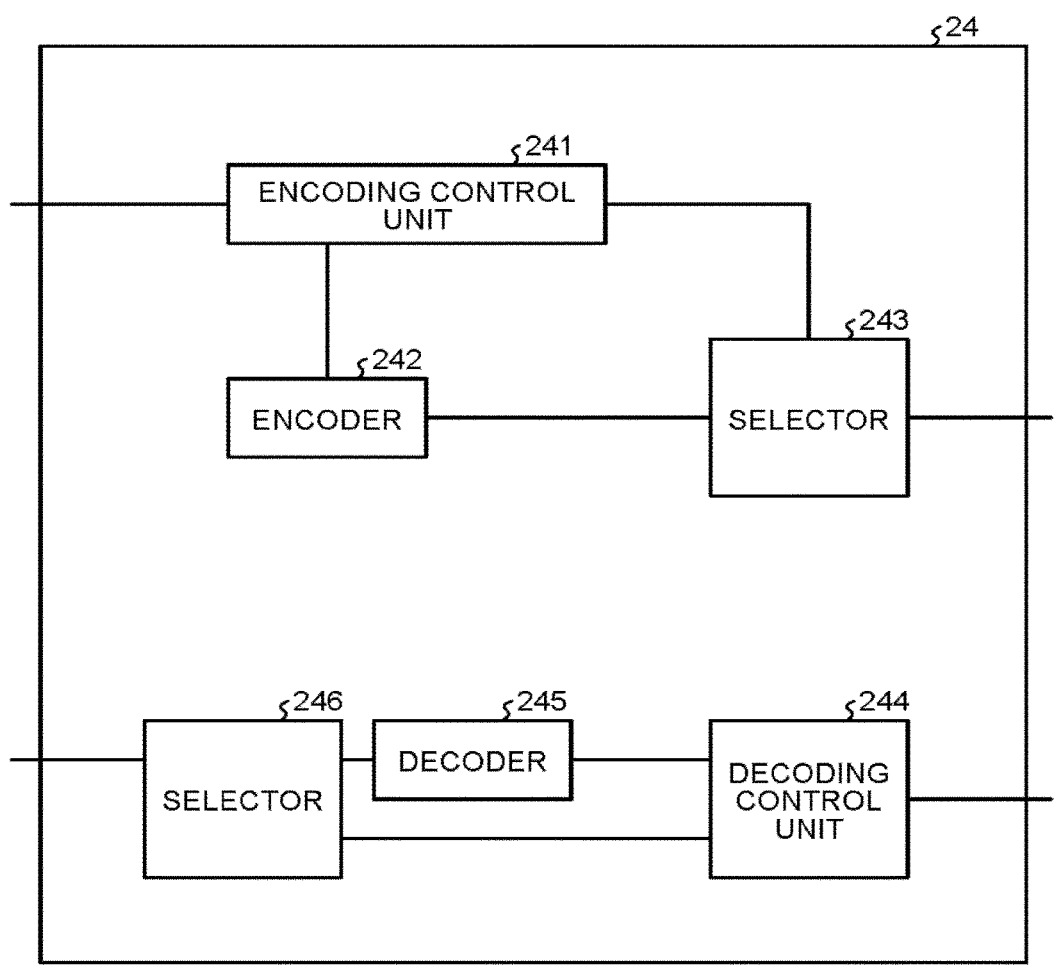
FIG. 4 is a diagram of an exemplary configuration of a code process unit according to the first embodiment.

FIG. 4 is a diagram of an exemplary configuration of the code process unit 24 according to the present embodiment. As illustrated in FIG. 4, the code process unit 24 according to the present embodiment includes an encoding control unit 241, an encoder 242, a selector 243, a decoding control unit 244, a decoder 245, and a selector 246.

When receiving an instruction for encoding from the control unit 23, the encoding control unit 241 reads the information source sequence to be encoded in the data buffer 25 by the information source signal, and inputs the information source sequence to the encoder 242 and the selector 243. The encoding control unit 241 obtains the bit length of the generated code words from the encoder 242, and determines whether to discontinue the encoding. Then, the encoding control unit 241 controls the selector 243 in accordance with the determination result.

The encoder 242 encodes the input information source signal and generates a code word. The encoder 242 notifies the encoding control unit 241 of the bit length of the generated code word. The selector 243 selects and outputs one of the code word output from the encoder 242 and the information source signal (the yet-to-be-encoded information source signal) output from the encoding control unit 241 in accordance with the instruction from the encoding control unit 241.

The decoding control unit 244 extracts the encoding information from the data read from the non-volatile memory 3, and inputs the read data to the decoder 245 or the selector 246 in accordance with the encoding information. The decoding control unit 244 instructs the selector 246 to select and output the data input from the decoder 245 until the decoding control unit 244 receives a notification indicating the completion of the decode process from the decoder 245. After receiving the notification indicating the completion of the decode process from the decoder 245, the decoding control unit 244 instructs the selector 246 to select and output the data (information source signal) input from the decoding control unit 244.

The decoder 245 decodes the input reception word. Note that reception words with a variable length are sequentially input to the decoder 245. The decoder 245 can determine the breakpoint between the reception words.

The selector 246 selects and outputs one of the data input from the decoder 245 and the data input from the decoding control unit 244 in accordance with the instruction from the decoding control unit 244.

Figure 5:
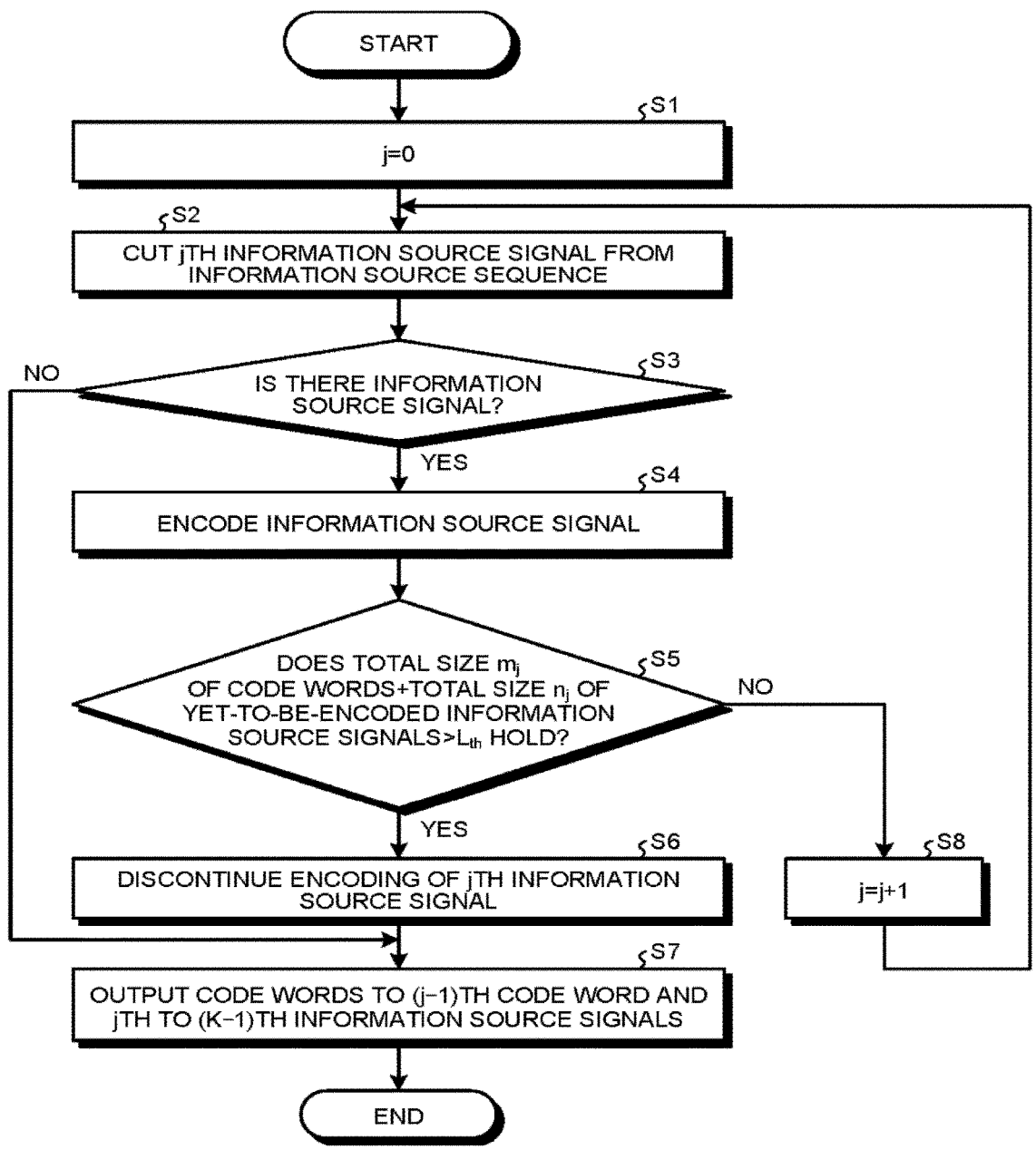
FIG. 5 is a diagram of an exemplary encoding process in the code process unit according to the first embodiment.

FIG. 5 is a diagram of exemplary procedures in an encoding process in the code process unit 24 according to the present embodiment. FIG. 5 illustrates an encoding process for an information source sequence. First, the encoding control unit 241 puts zero into a variable j that indicates the number of the information source signal to be encoded (step S1). The jth information source signal is cut from the information source sequence (step S2). Specifically, for example, the jth information source signal is read from the information source sequence stored in the data buffer 25. When the jth information source signal does not exist (step S3 No), the process goes to step S7. When the jth information source signal exists (step S3 Yes), the encoding control unit 241 inputs the jth information source signal to the encoder 242 and the selector 243. The encoder 242 encodes the input information source signal (step S4).

The encoding control unit 241 calculates the total size $m_j$ of the code words, namely, the total bit length of the code words generated from the zeroth to jth information source signals, and the total size $n_j$ of the yet-to-be-encoded information source signals. Note that $n_j$ can be calculated from $n_j=B-t_j$ when the total size of the zeroth to jth information source signals is $t_j$. Then, the encoding control unit 241 determines whether $m_j+n_j$ is larger than $L_{th}$ (step S5). When $m_j+n_j$ is smaller than or equal to $L_{th}$ (step S5 No), $j=j+1$ holds (step S8) and the process goes back to step S2.

When $m_j+n_j$ is larger than $L_{th}$ (step S5 Yes), the encoding control unit 241 discontinues the encoding of the jth information source signal (step S6). Specifically, the encoding control unit 241 instructs the selector 243 to select and output the information source signal input from the encoding control unit 241 as the jth information source signal, instead of the output from the encoder 242. As a result, the code word corresponding to the jth information source signal is not selected by the selector 243 and discarded. The code word and information source signal output from the selector 243 are stored the data buffer 25.

Next, the encoding control unit 241 reads the (j+1)th to (K−1)th information source signals and inputs the information source signals to the selector 243. Meanwhile, the encoding control unit 241 instructs the selector 243 to select and output the information source signal input from the encoding control unit 241. As a result, the code words to the j−1)th code word (the code words obtained by encoding the zeroth to (j−1)th information source signals, respectively), and the jth to (K−1)th information source signals are stored in the data buffer 25. The encoding control unit 241 outputs the code words to the (j−1)th code word, and the jth to (K−1)th information source signals to the memory I/F 22 (step S7), and the process is completed.

After the above-mentioned process, the memory I/F 22 writes the code words to the (j−1)th code word, and the jth to (K−1)th information source signals to the non-volatile memory 3. Note that, when the encoding information is stored in the non-volatile memory 3, the encoding information is also output to the memory I/F 22 in step S7 as described above. Note that the total bit length of the code words to the (j−1)th code word and the jth to (K−1)th information source signals is shorter than or equal to $L_{th}$. However, the total bit length is not always a constant length. In light of the foregoing, when the total bit length of the code words to the (j−1)th code word and the jth to (K−1)th information source signals does not reach $L_{th}$, for example, an arbitrary value can be written in the remaining part after the (K−1)th information source signal. This writing can provide data with $L_{th}$ bits. The value obtained by subtracting one from the value of j when the discontinuance of the encoding is determined in the process, namely, the value indicating the number of the last encoded information source signal when the largest number of the information source signals are encoded without exceeding $L_{th}$ corresponds to i illustrated in FIG. 3.

By the above-mentioned process, the encoding control unit 241 can determine the number of code words forming the third data (the i in FIG. 3) such that the total data length of the third data (a set of code words and the fourth data (the yet-to-be-encoded information source signals) is shorter than or equal to $L_{th}$, and the data length of the fourth data (the yet-to-be-encoded part in the information source sequence) is minimized.

Note that the information source signal can be the user data, or can be the data obtained by randomizing the user data. When the user data is randomized, the memory controller 2 includes a randomizer and a derandomizer, and randomizes the user data with the randomizer before or after the user data is stored in the data buffer 25. After that, the randomized user data is encoded as the information source sequence in the encoding process. When the data is read from the non-volatile memory 3, the read data is decoded and then the data is derandomized in a derandomization process in which the opposite conversion to the randomization is performed.

As described above, when all of the information source signals forming the information source sequence are encoded and the total bit length of the code words exceeds $L_{th}$, some of the information source signals are stored in the non-volatile memory 3 without being encoded in the present embodiment. As a result, the value of the memory region to be secured in the non-volatile memory 3 can previously be determined while the encoding in the variable length scheme is used. This enables efficient use of the memory region.

Second Embodiment

The memory system according to the second embodiment will be described next. The configuration of the memory system according to the present embodiment is similar to the configuration in the first embodiment. The different parts from the first embodiment will be described hereinafter.

Figure 6:
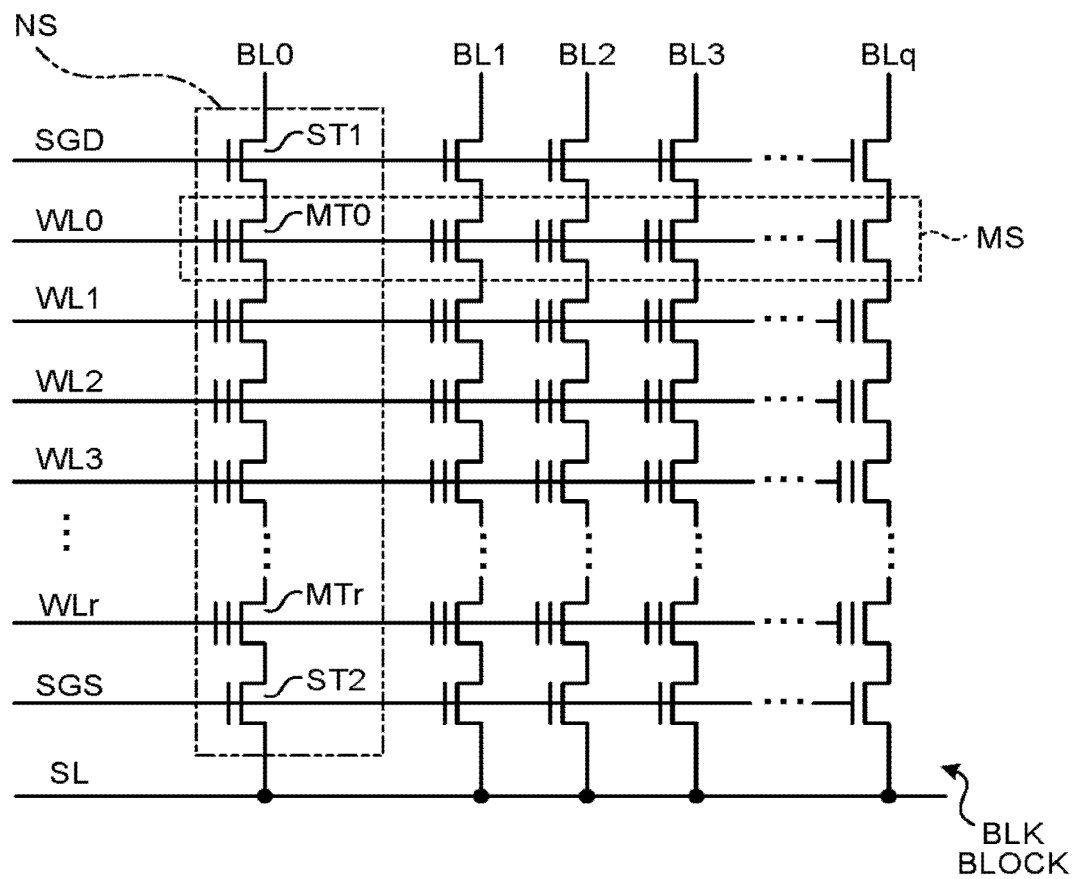
FIG. 6 is an exemplary configuration of a block of a memory cell array of a NAND memory.

As described in the first embodiment, the non-volatile memory 3 is, for example, a NAND memory. FIG. 6 is an exemplary configuration of a block of a memory cell array of a NAND memory. FIG. 6 illustrates a block among a plurality of blocks forming a memory cell array. The other blocks of the memory cell array have the similar configurations as illustrated in FIG. 6. As described in FIG. 6, a block BLK of the memory cell array includes (q+1) (q is an integer larger than or equal to zero) NAND strings NS. Each of the NAND strings NS includes (r+1) (r is an integer larger than or equal to zero) memory cell transistors MT0 to MTr and select transistors ST1 and ST2. The memory cell transistors MT0 to MTr are connected in series while sharing a diffusion region (a source region or a drain region) with the adjacent memory cell transistor MT. The select transistors ST1 and ST2 are placed on both ends of the column of the (r+1) memory cell transistors MT0 to MTr.

Word lines WL0 to WLr are connected to the control gate electrodes of the memory cell transistors MT0 to MTr forming a NAND string NS, respectively. The memory cell transistors MTh (h=zero to r) in NAND strings NS are commonly connected by a word line WLh (h=zero to r). In other words, the control gate electrodes of the memory cell transistors MTh on the same row in the block BLK are connected to the same word line WLh.

Each of the memory cell transistors MT0 to MTr is formed by a field-effect transistor having a stacked-gate structure formed on a semiconductor substrate. The stacked-gate structure includes a charge storage layer formed on the semiconductor substrate through a gate insulating film (a floating gate electrode), and a control gate electrode formed on the charge storage layer through an inter-gate insulating film. The threshold voltage of the memory cell transistors MT0 to MTr varies depending on the number of electrons stored in the floating gate electrode. The data is stored in accordance with the difference in the threshold voltage.

Bit lines BL0 to BLq are connected to the (q+1) select transistors ST1 in a block BLK, respectively. A select gate line SGD is commonly connected to the gates. The source of the select transistor ST1 is connected to the drain of the memory cell transistor MT0. Similarly, a source line SL is commonly connected to the sources of the (q+1) select transistors ST2, and a select gate line SGS is commonly connected to the gates in a block BLK. Furthermore, the drain of the select transistor ST2 is connected to the source of the memory cell transistor MTr.

Each memory cell is connected to a word line and a bit line. Each memory cell can be identified from the address identifying the word line and the address identifying the bit line. As described above, the data in the memory cells (the memory cell transistors MT) in a block BLK is deleted as a single unit. On the other hand, the data is read and written in a unit of memory cells commonly connected to a word line WL, namely, a unit of a memory group.

When the non-volatile memory 3 is a NAND memory and part of data is stored in the non-volatile memory 3 without being encoded as described in the first embodiment, the yet-to-be-encoded data is placed at the end of the information source sequence. For example, a unit of data to be stored in a page is formed by four information source sequences. A region corresponding to a page from which a part storing management information such as the encoding information is removed in the non-volatile memory 3 is divided into four. The encoded data (in which all or some of the data items are encoded) corresponding to the information source sequences are stored in the four regions, respectively. For example, the number of each bit line is fixedly assigned to each of the four regions. There is an increased possibility in the example that the yet-to-be-encoded data item can be stored in a memory cell connected to a bit line corresponding to the latter part of the information source sequence because the yet-to-be-encoded data item is placed in the latter part.

Figure 7:
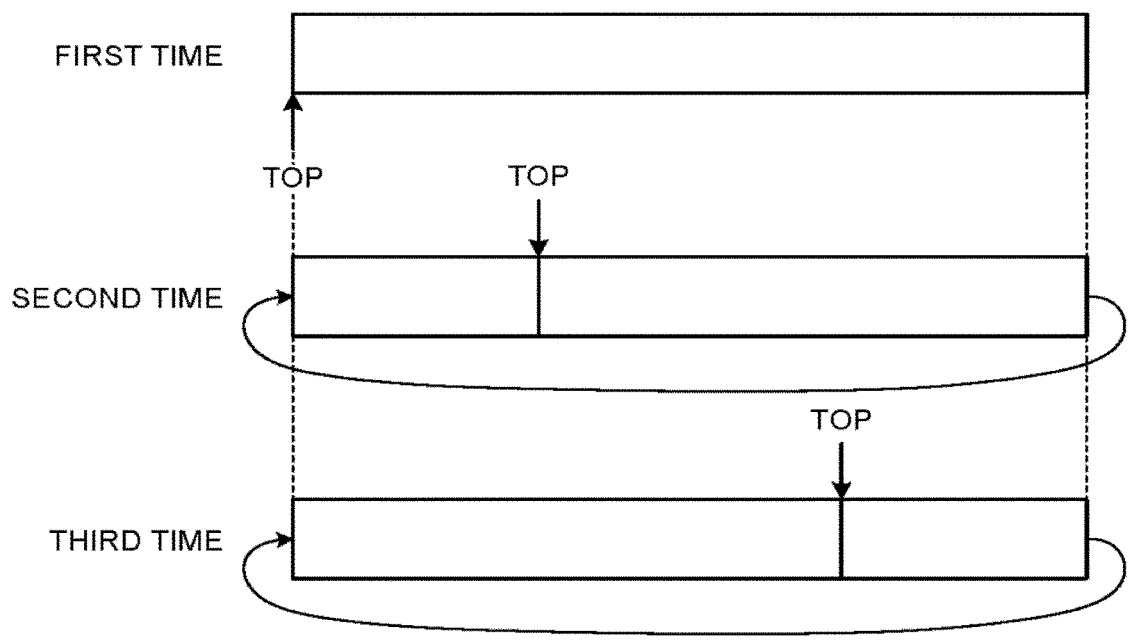
FIG. 7 is a diagram of exemplary rotation of a writing-start position (namely, a bit line to which a memory cell where the writing of data starts is connected)

To avoid storing data without being encoded, in other words, to avoid fixing the memory region with a low reliability, the present embodiment changes the writing-start position from which a new data item is written when the data stored in the memory region in the non-volatile memory 3 is deleted and the new data item is written in the memory region. For example, the writing-start position is rotated every time a new data item is written. FIG. 7 is a diagram of exemplary rotation of the writing-start position (namely, the bit line to which the memory cell in which the data item is to be written is connected). When the memory region for an information source sequence has $L_{th}$ bits, the encoded data corresponding to the information source sequence (the data of which whole or a part is encoded) is stored from the top of the memory region in the first writing process, and the data after the encoding is written from the position moved from the top by a predetermined number of bits in the memory region in the second writing process as illustrated in FIG. 7. As described above, the position is moved by a predetermined number of bits every time data is written.

As described above, changing the writing-start position can prevent the decrease in reliability of a specific memory region. Specifically, when the non-volatile memory 3 of which fatigue degree varies depending on the value to be written is used, changing the writing-start position can prevent the increase, in fatigue degree of a specific memory cell.

Third Embodiment

Figure 8:
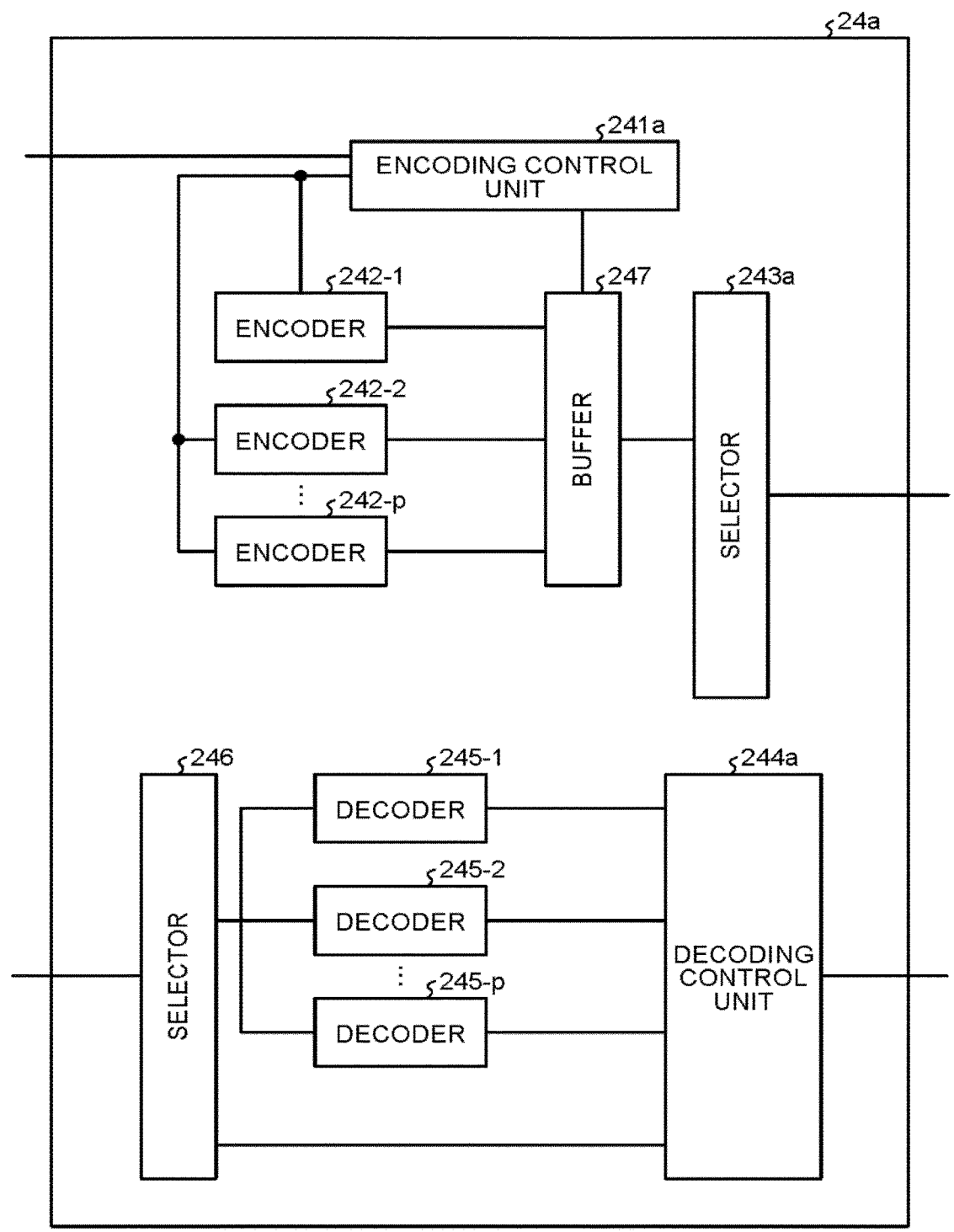
FIG. 8 is an exemplary configuration of a code process unit according to a third embodiment.

FIG. 8 is a diagram of an exemplary configuration of a code process unit 24a according to the third embodiment. The memory system according to the present embodiment has a similar configuration to the configuration in the first embodiment except that the memory system according to the present embodiment has the code process unit 24a instead of the code process unit 24. The different point from the first embodiment will be described hereinafter.

When an encoding process is performed in the method described in the first embodiment, the encoded information source sequence can be stored in the memory region with a fixed size. However, some of the information source signals are stored in the non-volatile memory without being encoded. To increase the reliability, the number of information source signals stored in the non-volatile memory 3 without being encoded is preferably reduced. On the other hand, even when the same data items are encoded, the bit length of the cord words generated by the encoding varies depending on the encoding scheme. The bit lengths vary depending on the encoding scheme. In light of the foregoing, the present embodiment encodes an information source sequence with a plurality of encoding schemes in the method described in the first embodiment. Then, the information source sequence including the largest number of encoded information source signals among the information source sequences generated by the encoding schemes is written in the non-volatile memory 3.

As illustrated in FIG. 8, the code process unit 24a according to the present embodiment includes an encoding control unit 241a, encoders 242-1 to 242-p, a selector 243a, a decoding control unit 244a, decoders 245-1 to 245-p, a selector 246, and a buffer 247. The p is an integer more than or equal to two.

When receiving an instruction for encoding data from the control unit 23, the encoding control unit 241a reads the information source sequence to be encoded in the data buffer 25 by the information source signal, and inputs the information source sequence to the encoders 242-1 to 242-p. The encoding control unit 241a selects the code word generated by one of the encoders 242-1 to 242-p in accordance with the bit lengths of the code words generated by the encoders 242-1 to 242-p, and instructs the buffer 247 to output the selected code word. When the buffer 247 completes the output, the encoding control unit 241a outputs the yet-to-be-encoded information source signals.

The encoders 242-1 to 242-p encode the input information source signals and generate code words, respectively. The encoders 242-1 to 242-p then store the generated code words in the buffer 247. In other words, the encoders 242-1 to 242-p encode the information source signals with the first to pth encoding schemes, respectively. Furthermore, the encoders 242-1 to 242-p notify the encoding control unit 241a of the bit lengths of the generated code words. The encoders 242-1 to 242-p perform encoding processes with different schemes from each other. The buffer 247 stores the code words output from the encoders 242-1 to 242-p. The buffer 247 holds the code words from the code word corresponding to the zeroth information source signal to the latest code word generated by the encoders 242-1 to 242-p. The buffer 247 outputs the code word output from one of the encoders 242-1 to 242-p in accordance with the instruction from the encoding control unit 241a. Note that, in the outputting, the buffer 247 discards the latest code word, and outputs the code words from the code word corresponding to the zeroth information source signal to the code word just before the latest code word in order of storage.

The decoding control unit 244a extracts the encoding information from the data read from the non-volatile memory 3 to select one of the decoders 245-1 to 245-p in accordance with the encoding information. The decoding control unit 244a inputs the information source signal to the selected decoder 245 and the selector 246. Note that, in the present embodiment, the information indicating which scheme the data is encoded with is stored in addition to the information similar to the information in the first embodiment as the encoding information. Until receiving a notification of the completion of the decoding process from the selected decoders 245-1 to 245-p, the decoding control unit 244a instructs the selector 246 to select and output the data input from the decoders 245-1 to 245-p. When receiving a notification of the completion of the decoding process from the decoder 245, the decoding control unit 244a instructs the selector 246 to select and output the data (the information source signals) input from the decoding control unit 244a.

The decoders 245-1 to 245-p decode the input reception words, respectively. The decoder 245-1 to 245-p decode the reception words with the decoding schemes corresponding to the encoding schemes of the encoders 242-1 to 242-p, respectively.

The selector 246 selects and outputs one of the data items input from the decoders 245-1 to 245-p and the data items input from the decoding control unit 244 in accordance with the instruction from the decoding control unit 244a.

For example, the Reverse Tunstall coding and Reverse Huffman coding that use different types of codes can be used as the encoding schemes. However, schemes in which the same codes are used and the code words correspond to the information source signals in different ways may be employed. In the first embodiment, FIG. 2 illustrates the correspondence of the information source signals and the code words in the Reverse Tunstall coding. In FIG. 2, the information source signal has four bits and there are 16 possible values of the information source signal. In other words, the table in FIG. 2 has 16 rows. There are 16! (! means a factorial) possible methods to link the 16 information source signals to the 16 code words one by one illustrated in FIG. 2. FIG. 2 merely illustrates an example.

FIG. 9 is a diagram of exemplary Reverse Tunstall coding different from the Reverse Tunstall coding illustrated in FIG. 2. FIG. 9 illustrates an example of a different correspondence of the information source signals and the code words from the correspondence illustrated in FIG. 2, using the 16 information source signals and 16 code words illustrated in FIG. 2. FIG. 9 illustrates that the zeros and ones of the information source signals corresponding to the code words are inverse to the zeros and ones in the example illustrated in FIG. 2. For example, the information source signal corresponding to the code word "11010" on the first row is "1001" in the example of FIG. 2 whereas "0110" in the example of FIG. 9. Changing the correspondence of the information source signal and the code word as described above can implement a different encoding scheme. Note that the variations in correspondence of the information source signal and the code word is not limited to the example of FIG. 9.

As described above, when the same information source signal is encoded with different encoding schemes, the bit lengths of the code words are not necessarily the same. For example, the information source signal "1001" corresponds to the five-bit code word "11010" in the example of FIG. 2 whereas the information source signal "1001" corresponds to the three-bit code word "010" in the example of FIG. 9. Accordingly, when the information source signals forming an information source sequence are sequentially encoded with a plurality of the encoding schemes and the encoding is discontinued as described in the first embodiment, the number of the encoded code words sometimes varies depending on the encoding scheme. Accordingly, in the present embodiment, the information source sequence including the largest number of encoded information source signals among the information source sequences generated by the encoding processes with the encoding schemes is written into the non-volatile memory 3. This improves the reliability.

Figure 10:
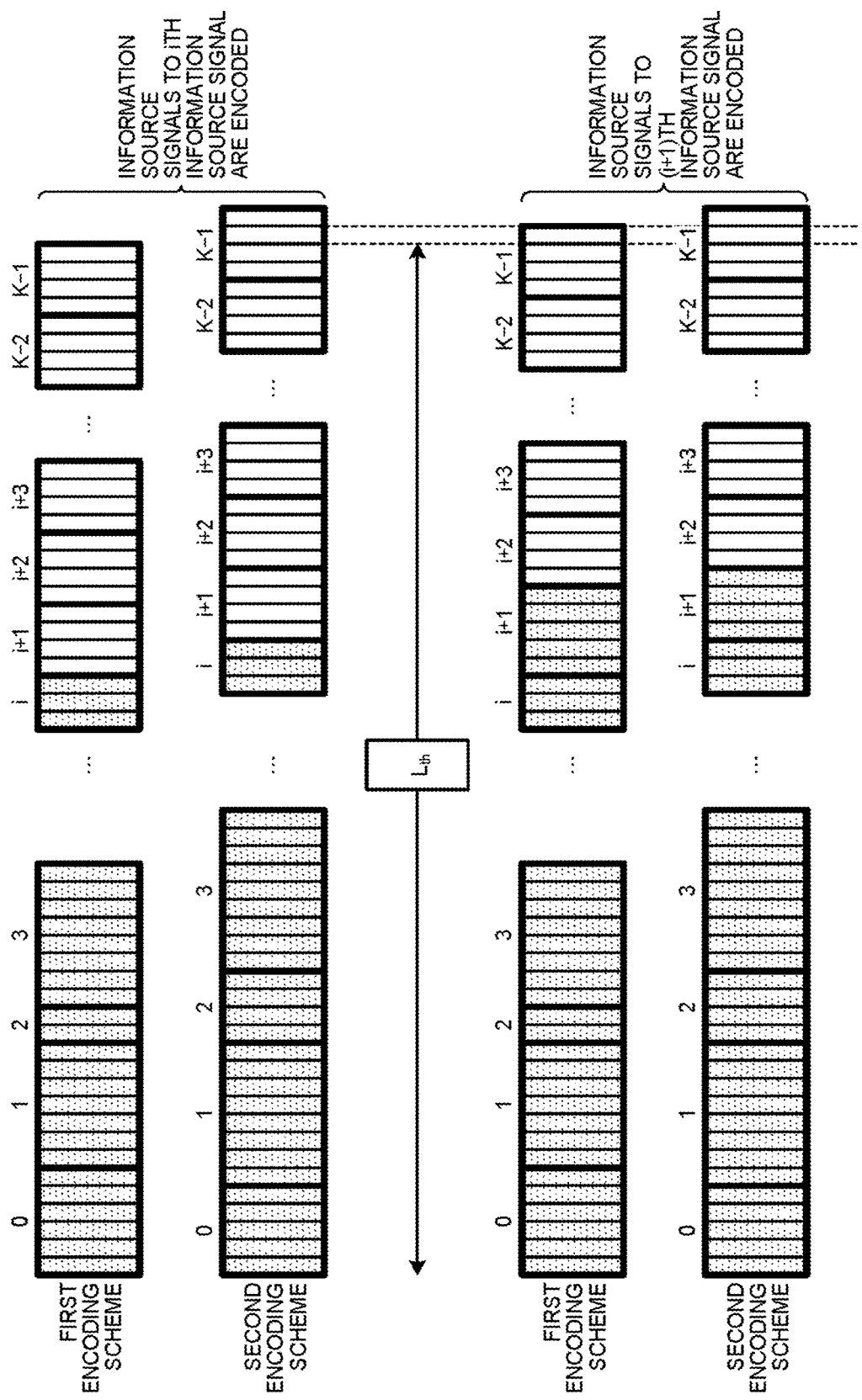
FIG. 10 is a schematic diagram of an exemplary encoding process according to the third embodiment.

FIG. 10 is a schematic diagram of an exemplary encoding process according to the present embodiment. FIG. 10 illustrates an example in which the B-bit information source sequence is divided into four-bit information source signals, similarly to the example of FIG. 3 in the first embodiment. FIG. 10 illustrates the example in which two types of encoding schemes, a first encoding scheme and a second encoding scheme, are used. Small rectangles illustrated in FIG. 10 are a bit. Parts shaded with dots are code words, and the other parts that are not shaded are the information source signals in FIG. 10.

A state in which the zeroth to ith information source signals are encoded with the first encoding scheme is illustrated on the first row in FIG. 10. A state in which the zeroth to ith information source signals are encoded with the second encoding scheme is illustrated on the second row in FIG. 10. The information source signals to the ith information source signal are encoded. The sum of the total number of bits of the generated code words and the total number of bits of the yet-to-be-encoded information source signals exceeds $L_{th}$ in the second encoding scheme whereas the sum is less than or equal to $L_{th}$ in the first encoding scheme.

A state in which the zeroth to (i+1)th information source signals are encoded is illustrated on the third row in FIG. 10. A state in which the zeroth to (i+1)th information source signals are encoded with the second encoding scheme is illustrated on the fourth row in FIG. 10. When the information source signals to the (i+1)th information source signal are encoded, the sum of the total number of bits of the generated code words and the total number of bits of the yet-to-be-encoded information source signals exceeds $L_{th}$ in both of the first encoding scheme and the second encoding scheme. When the sum of the total number of bits of the generated code words and the total number of bits of the yet-to-be-encoded information source signals exceeds $L_{th}$ in all of the encoding schemes as described above, the last generated code word is discarded in the present embodiment. When the information source signals to the ith information source signal are encoded, the sum of the total number of bits of the generated code words and the total number of bits of the yet-to-be-encoded information source signals is less than or equal to $L_{th}$ in the first encoding scheme. Thus, the code words to the ith code word encoded with the first encoding scheme and the (i+1)th information source signal and subsequent information source signals are stored in the non-volatile memory 3.

When the information source signals to the ith information source signal are encoded, the sum of the total number of bits of the generated code words and the total number of bits of the yet-to-be-encoded information source signals exceeds $L_{th}$ in the second encoding scheme. Thus, in order to limit the sum to $L_{th}$ or lower, the information source signals up to the ith information source signal are encoded. In light of the foregoing, the code words to the ith code word generated with the first encoding scheme that can encode the larger number of information source signals are selected from the code words generated with the two encoding schemes in the present embodiment. The ith code word generated with the first encoding scheme and the (i+1)th and subsequent information source signals are stored in the non-volatile memory 3.

Figure 11:
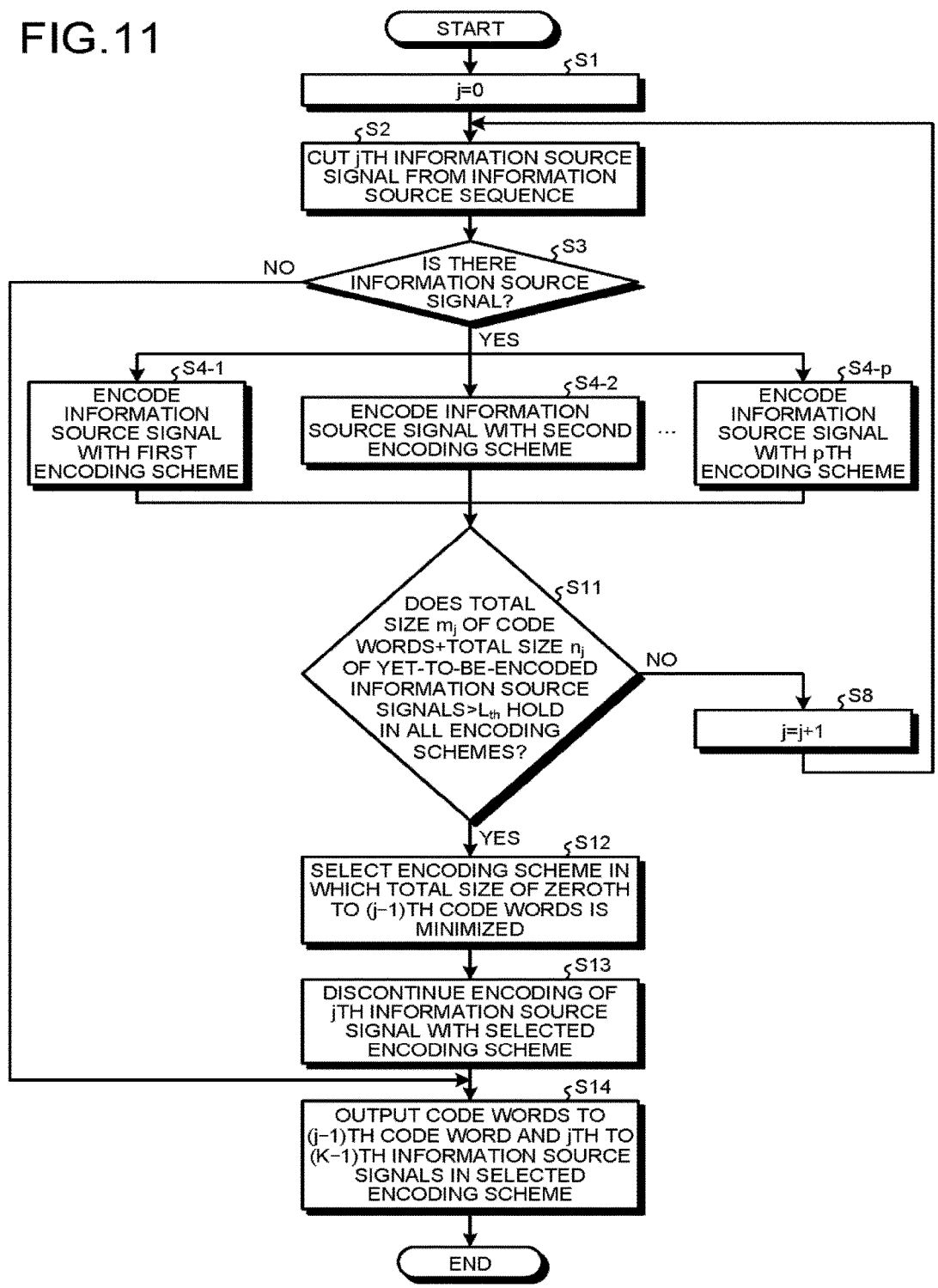
FIG. 11 is a diagram of exemplary procedures of an encoding process in the code process unit according to the third embodiment.

FIG. 11 is a diagram of exemplary procedures of an encoding process in the code process unit 24a according to the present embodiment. The process in steps S1 to S3 is similar to the process in the first embodiment. If the process goes to Yes in step S3, an encoder 242-1 encodes the information source signals with the first encoding scheme (step S4-1), an encoder 242-2 encodes the information source signals with the second encoding scheme (step S4-2), . . . , and an encoder 242-*p* encodes the information source signals with the pth encoding scheme (step S4-*p*). Each of the encoders 242-1 to 242-*p* encodes the information source signals as described above.

The encoding control unit 241*a* calculates the total size $m_j$ of the code words, and the total size $n_j$ of the yet-to-be-encoded information source signals for each of the encoders 242-1 to 242-*p*, namely, each of the encoding schemes. The total size $m_j$ is the total bit length of the code words generated based on the zeroth to jth information source signals. Note that $n_j$ can be found from $n_j=B-m_j$. Then, the encoding control unit 241*a* determines whether $m_j+n_j$ is larger than $L_{th}$ in all of the encoding schemes (step S11). When $m_j+n_j$ is smaller than or equal to $L_{th}$ in all of the encoding schemes (step S11 No), j=j+1 holds (step S8), and the process goes back to step S2.

When there is an encoding scheme in which $m_j+n_j$ is larger than $L_{th}$ (step S11 Yes), the encoding control unit 241*a* selects the encoding scheme in which the total size of the zeroth to (j−1)th code words is minimized (step S12) from the encoding schemes. If there are a plurality of encoding schemes in which the total size of the zeroth to (j−1)th code words is minimized, one of the encoding schemes is arbitrarily selected. For example, the encoding schemes are prioritized in advance, and one of the encoding schemes can be selected according to the priority, or can be selected in accordance with another criterion. The encoding control unit 241*a* discontinues the encoding of the jth information source signal in the selected encoding scheme (step S13). Specifically, the encoding control unit 241*a* instructs the buffer 247 to select and output the zeroth to (j−1)th code words of the selected encoding scheme. As a result, the jth code word of the selected encoding scheme is discarded. Note that the code words generated with the encoding schemes other than the selected encoding scheme are also discarded.

Next, the buffer 247 outputs the zeroth to (j−1)th code words, and the encoding control unit 241*a* reads and outputs the jth to (K−1)th information source signals from the data buffer 25 (step S14). Then, the process is completed. If the process in step S3 goes to No, the process goes to step S14.

By the process described above, the encoding control unit 241*a* can determine the encoding scheme and the number of code words forming the third data such that the total data length of the third data (a group of code words) and the fourth data (a yet-to-be-encoded part) is shorter than or equal to the second data length, and the data length of the fourth data is minimized.

After that, the zeroth to (j−1)th code words and the jth to (K−1)th information source signals are written into the non-volatile memory 3, similarly to the first embodiment. In the writing, the writing-start position can be rotated as described in the second embodiment.

Furthermore, the encoding control unit 241*a* stores the information indicating which encoding scheme is selected in the encoding information in the present embodiment. This enables the decoding control unit 244*a* to select the decoders 245-1 to 245-*p* to be used to decode data when the data is read.

In the present embodiment as described above, the information source signals are encoded with a plurality of encoding schemes. The encoding scheme in which the largest number of information source signals is encoded in the information source sequence is selected. The information source signals encoded with the selected encoding scheme and the remaining information source signals are stored in the non-volatile memory 3. This can increase the number of the encoded information source signals, and thus can improve the reliability.

Fourth Embodiment

Figure 12:
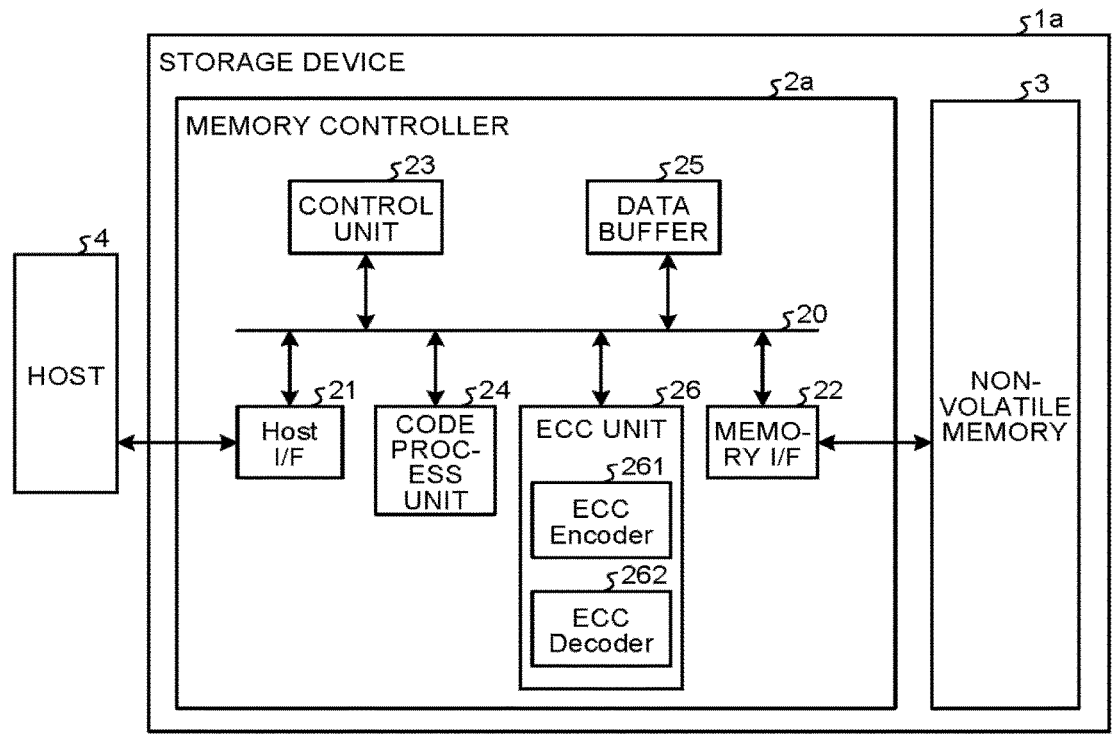
FIG. 12 is a block diagram of an exemplary configuration of a storage device according to a fourth embodiment.

FIG. 12 is a block diagram of an exemplary configuration of the storage device according to the fourth embodiment. A storage device 1*a* according to the present embodiment includes a memory controller 2*a* and the non-volatile memory 3. The components having the same functions as the first embodiment will be put with the same reference numbers and the overlapping descriptions will be omitted. The parts different from the first embodiment will be described hereinafter.

The memory controller 2*a* is the memory controller 2 according to the first embodiment to which an Error Correcting Code (ECC) unit 26 is added. The ECC unit 26 includes an ECC Encoder (error correction encoder) 261 and ECC Decoder (error correction decoder) 262.

The exemplary encoding that generates the code words in which zero and one occur at different occurrence rates in order to increase the reliability of the non-volatile memory 3 is described in the first embodiment. The exemplary encoding is referred to as error curb encoding. An example in which error correction encoding is performed in addition to the error curb encoding in order to further improve the reliability is described in the present embodiment.

The processes for the error curb encoding and the decoding in the present embodiment are similar to the processes in the first embodiment. In the present embodiment, the zeroth to ith code words and the (i+1)th to (K−1)th information source signals are input to the ECC Encoder 261. The zeroth to ith code words are the data generated by the encoding process described in the first embodiment. When the bit length of the zeroth to ith code words and the (i+1)th to (K−1)th information source signals in the inputting is shorter than $L_{th}$, the encoding control unit 241 puts a predetermined value (for example, zero) until the bit length reaches $L_{th}$. As a result, the data having a bit length of $L_{th}$ is input to the ECC Encoder 261.

The ECC Encoder 261 generates an error-corrected code word by encoding the input data with the error correction encoding. Any scheme can be used as error correction encoding. However, for example, Reed Solomon (RS) encoding, and Bose Chaudhuri Hocquenghem (BCH) coding can be used. The ECC Encoder 261 can encode the data obtained by adding the encoding information to the zeroth to ith code words and the (i+1)th to (K−1)th information source signals with the error correction encoding.

The control unit 23 instructs the ECC Encoder 262 to perform the error correction encoding when data is written to the non-volatile memory 3. The memory I/F 22 writes the error-corrected code word output from the ECC Encoder 262 into the non-volatile memory 3 in accordance with the instructions from the control unit 23.

The control unit 23 instructs the ECC Decoder 262 to perform the error correction decoding when the data is read from the non-volatile memory 3. The ECC Decoder 262 decodes the data from the non-volatile memory 3 with the error correction decoding. The result from the error correction decoding is input to the code process unit 24.

The error correction encoding is performed after the error curb encoding in the example described above. Note that, however, the user data is encoded with the error correction encoding first and then the code word after the error correction encoding can be encoded with the error curb encoding as the information source sequence described in the first embodiment. However, when the encoding information is stored together with the corresponding data in the non-volatile memory 3, the error correction encoding is preferably performed after the error curb encoding in order to protect the encoding information by the error correction encoding.

Figure 13:
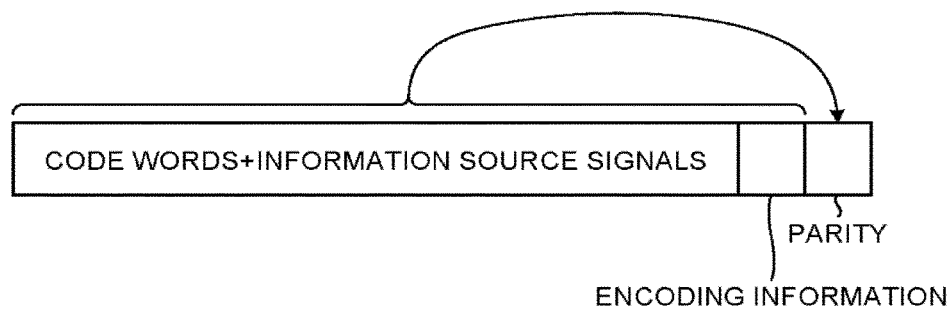
FIG. 13 is a diagram of an exemplary configuration of an error-corrected code word according to the fourth embodiment.

FIG. 13 is a diagram of an exemplary configuration of the error-corrected code word according to the present embodiment. In the example of FIG. 13, the data after the error curb encoding process (the code words+the information source signals) and the encoding information are encoded with the error correction encoding and parity is generated. The parity is stored together with the data after the error curb encoding and the encoding information to the non-volatile memory 3.

An example in which the data is encoded with the error correction encoding by the information source sequence is described in the present embodiment. However, the unit to perform the error correction encoding is not limited to the example. A plurality of information source sequences can be regarded as an input. Then, an error-corrected code word can be generated from the information source sequences with the error correction encoding. Alternatively, the data that corresponds to an information source sequence and is encoded with the error curb encoding is divided into a plurality of data items, and the divided data items can be encoded in the error correction encoding.

The error correction encoding can be added to an embodiment in which the writing-start position is rotated as described in the second embodiment. Alternatively, the error correction encoding can be added when the error correction encoding process is performed with a plurality of encoding schemes as described in the third embodiment.

As described above, the data encoded with the error curb encoding is encoded with the error correction encoding and stored in the non-volatile memory 3 in the present embodiment. This can improve the reliability more than the first embodiment does.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A memory system comprising:
a non-volatile memory;
an encoding unit that generates a code word in which zero and one occur at different occurrence rates by encoding data; and
a control unit that causes the encoding unit to encode k first data items among second data items and writes k third data items and fourth data items into the non-volatile memory, the second data items including n first data items, the k being an integer larger than or equal to zero and smaller than or equal to n, the n being an integer larger than or equal to two, the k third data items being obtained by the encoding unit, the fourth data items being obtained by removing data corresponding to the k third data items from the second data items, each of the k third data items being generated by encoding each of the k first data items with the encoding unit.

2. The memory system according claim 1, further comprising:
an encoding control unit that determines a value of the k such that a total data length of the k third data items and the fourth data items is shorter than or equal a certain length, and a data length of the fourth data items is minimized.

3. The memory system according to claim 1,
wherein, when the control unit performs a second writing after a first writing, the control unit writes new k third data items and fourth data items from a position different from a writing-start position in the first writing in a certain memory region, the first writing being writing the k third data items and the fourth data items into the certain memory region in the non-volatile memory, the second writing including deleting the k third data items and the fourth data items and writing the new k third data items and fourth data items into the certain memory region.

4. The memory system according to claim 1,
wherein the encoding unit includes:
a plurality of encoders including encoding schemes different from one another; and
an encoding control unit that selects an encoder among the encoders such that a total data length of the k third data items and the fourth data items is shorter than or equal to a certain data length, and a data length of the fourth data items is minimized.

5. The memory system according to claim 1, further comprising:
an error correction encoder that encodes the k third data items and the fourth data items with error correction encoding,
wherein the control unit writes the k third data items and the fourth data items encoded with the error correction encoding into the non-volatile memory.

6. The memory system according to claim 1,
wherein the second data items are randomized data.

7. The memory system according to claim 1,
wherein the encoding is Reverse Huffman coding, Reverse Tunstall coding, or Reverse Tunstall Huffman coding.

8. The memory system according to claim 1, being connectable to a host,
wherein the second data item is data designated by a write request received from the host.

9. A memory controller that controls a non-volatile memory, the memory controller comprising:
an encoding unit that generates a code word in which zero and one occur at different occurrence rates by encoding data; and
a control unit that causes the encoding unit to encode k first data items among second data items and writes k third data items and fourth data items into the non-volatile memory, the second data items including n first data items, the k being an integer larger than or equal to zero and smaller than or equal to n, the n being an integer larger than or equal to two, the k third data items being obtained by the encoding unit, the fourth data items being obtained by removing data corresponding to the k third data items from the second data items, each of the k third data items being generated by encoding each of the k first data items with the encoding unit.

10. The memory controller according to claim 9, further comprising:
an encoding control unit that determines a value of the k such that a total data length of the k third data items and the fourth data items is shorter than or equal to a certain data length, and a data length of the fourth data items is minimized.

11. The memory controller according to claim 9,
wherein, when the control unit performs a second writing after a first writing, the control unit writes new k third data items and fourth data items from a position different from a writing-start position in the first writing in a certain memory region, the first writing being writing the k third data items and the fourth data items into the certain memory region in the non-volatile memory, the second writing including deleting the k third data items and the fourth data items and writing the new k third data items and fourth data items into the certain memory region.

12. The memory controller according to claim 9,
wherein the encoding unit includes:
a plurality of encoders including encoding schemes different from one another; and
an encoding control unit that selects an encoder among the encoders such that a total data length of the k third data items and the fourth data items is shorter than or equal to a certain data length, and a data length of the fourth data items is minimized.

13. The memory controller according to claim 9, further comprising:
an error correction encoder that encodes the k third data items and the fourth data items h error correction encoding,
wherein the control unit writes the k third data items and the fourth data items encoded with the error correction encoding into the non-volatile memory.

14. A non-volatile memory control method, the method comprising:
encoding k first data items among second data items, the encoding being encoding to generate a code word in which zero and one occur at different occurrence rates; and
writing k third data items and fourth data items into a non-volatile memory, the second data items including n first data items, the k being an integer larger than or equal to zero and smaller than or equal to n, the n being an integer larger than or equal to two, the k third data items being obtained by encoding k second data items among first data items including n second data items and having a first data length, the fourth data items being obtained by removing data corresponding to the k third data items from the second data items, each of the k third data items being generated by encoding each of the k first items with encoders.

15. The method according to claim 14, further comprising:
determining a value of the k such that a total data length of the k third data items and the fourth data items is shorter than or equal to a certain data length, and a data length of the fourth data items is minimized.

16. The method according to claim 14, further comprising:
writing, when a second writing is performed after a first writing, new k third data items and fourth data items from a position different from a writing-start position in the first writing in a certain memory region, the first writing being writing the k third data items and the fourth data items into the certain memory region in the non-volatile memory, the second writing including deleting the k third data items and the fourth data items and writing the new k third data items and fourth data items into the certain memory region.

17. The method according to claim 14, further comprising:
performing the encoding with a plurality of encoding schemes; and
selecting an encoding scheme among the encoding schemes such that a total data length of the k third data items and the fourth data items is shorter than or equal to a certain data length, and data length of the fourth data items is minimized.

18. The method according to claim 14, further comprising:
encoding the k third data items and the fourth data items with error correction encoding; and
writing the k third data items and fourth data items encoded with the error correction encoding into the non-volatile memory.

19. The method according to claim 14,
wherein the second data items are randomized data.

20. The method according to claim 14,
wherein the encoding is Reverse Huffman coding, Reverse Tunstall coding, or Reverse Tunstall Huffman coding.

* * * * *